United States Patent [19]

Myers et al.

[11] Patent Number: 5,122,753
[45] Date of Patent: Jun. 16, 1992

[54] METHOD OF TESTING ELECTRICAL COMPONENTS FOR DEFECTS

[75] Inventors: Thomas K. Myers, Austin, Tex.; John D. Ferguson, San Diego, Calif.

[73] Assignee: Microelectronics and Computer Technology Corporation, Austin, Tex.

[21] Appl. No.: 631,111

[22] Filed: Dec. 20, 1990

[51] Int. Cl.[5] .............................................. G01R 31/02
[52] U.S. Cl. ................................ 324/537; 324/158 R; 324/527
[58] Field of Search .......... 324/537, 501, 551, 158 R, 324/158 F, 555, 527

[56] References Cited

U.S. PATENT DOCUMENTS

| | | | |
|---|---|---|---|
| 4,056,773 | 11/1977 | Sullivan | 324/73 |
| 4,176,780 | 12/1979 | Sacher et al. | 235/302 |
| 4,194,113 | 3/1980 | Fulks et al. | 371/20 |
| 4,196,386 | 4/1980 | Phelps | 324/73 |
| 4,387,304 | 6/1983 | Younkin | 250/492.2 |
| 4,550,406 | 11/1985 | Neal | 371/20 |
| 4,622,647 | 11/1986 | Sagnard et al. | 364/580 |
| 4,678,988 | 7/1987 | Brust | 324/158 |
| 4,709,366 | 11/1987 | Scott et al. | 371/80 |
| 4,745,362 | 5/1988 | Brust | 324/158 |
| 4,766,372 | 8/1988 | Rao | 324/158 |
| 4,772,846 | 9/1988 | Reeds | 324/158 |
| 4,791,358 | 12/1988 | Sauerwald et al. | 324/71 |
| 4,829,243 | 5/1989 | Woodard, Sr. et al. | 324/158 |
| 4,843,329 | 6/1989 | Beha et al. | 324/501 |

OTHER PUBLICATIONS

Brunner et al., "A Dynamic Single E-Beam Short/Open Testing Technique", Scanning Electron Microscopy, 1985, pp. 991-999.
Brunner et al., "Bare-Board e-Beam Testing: The Charge Storage Problem", Microelectronic Engineering 8, 1988, pp. 25-35.
Woodard et al., "Voltage Contrast Electron Beam Testing Experiments on VLSI Chip Packaging Substrates", Journal of Vacuum Science and Technology, vol. 6, No. 6, Dec. 1988, pp. 1966-1970.
Schmid et al., "Design and Application of an e-Beam Test System for Microwiring Substrates", 34th Electron, Ion and Photon Beams Conference, May 1990.

Primary Examiner—Edward L. Coles, Sr.
Assistant Examiner—R. Bacares
Attorney, Agent, or Firm—David M. Sigmond

[57] ABSTRACT

A method of testing electrical circuits on a substrate for detecting shorts and opens. A plurality of electrical networks in which each network has one or more nodes are tested by selectively electrically charging certain nodes and selectively testing other nodes for detecting shorts and opens between the nodes. The method of testing allows various levels of testing to be performed for detecting more and greater different kinds of possible defects.

9 Claims, 7 Drawing Sheets

| | | | | | | | |
|---|---|---|---|---|---|---|---|
| L(1) | 2a, | 2b, | | | | | |
| L(2) | 2c, | 2d, | | | | | |
| L(3) | 3a, | 3b, | 3c, | 3d, | 4a, | 4b, | 4c, | 4d |
| L(4) | 5a, | 5b, | 5c | | | | | |
| L(5) | 5d, | 6a, | 6b, | 6c, | 6d, | | | |
| L(6) | 7a, | 7b, | 7c, | 7d, | 7e, | 8e, | 8f | |
| L(7) | 8a, | 8b, | 8c, | 8d, | 9d, | 9e | | |
| L(8) | 9a, | 9b, | 9c | | | | | |
| L(9) | 9f, | 9g, | 10c, | 10d, | 10e | | | |
| L(10) | 10a, | 10b, | 10f, | 10g, | 9h | | | |
| L(11) | 11a, | 11b, | 11f, | 11g | | | | |
| L(12) | 11c, | 11d, | 11e | | | | | |

DEFECTIVE CONNECTED NODES

| | |
|---|---|
| N2(1) | a, b |
| N2(2) | c, d |
| N3(1) | a, b, c, d |
| N4(1) | a, b, c, d |
| N5(1) | a, b, c |
| N5(2) | d |
| N6(1) | a, b, c, d |
| N7(1) | a, b, c, d, e |
| N8(1) | a, b, c, d |
| N8(2) | e, f |
| N9(1) | a, b, c |
| N9(2) | d, e |
| N9(3) | f, g |
| N9(4) | h |
| N10(1) | a, b, f, g |
| N10(2) | c, d, e |
| N11(1) | a, b, f, g |
| N11(2) | c, d, e |

DEFECTIVE CONNECTED
NODES IN EACH NETWORK

METHOD OF TESTING ELECTRICAL COMPONENTS FOR DEFECTS

A portion of the disclosure of this patent document contains material which is subject to copyright protection. The copyright owner has no objection to the facsimile reproduction by anyone of the patent documentation or the patent disclosure, as it appears in the Patent and Trademark Office file or records, but otherwise reserves all copyright rights whatsoever.

MICROFICHE APPENDIX

Portions of the specification of this application including computer program listings have been submitted as a microfiche appendix, including 1 microfiche film with a total of 51 frames.

BACKGROUND OF THE INVENTION

1. Field of the Invention

The present invention is directed to a method of detecting faults or defects in a plurality of electrical networks in an electrical component such as a substrate, preferably using contactless methods of electrical testing.

2. Description of Related Art

Test and inspection are keys in reducing costs and increasing functionality of electrical networks in an electrical component. For example, VLSI chip packaging densities require finer line widths and more substrate interconnection networks which are taxing conventional methods of testing. While the present invention provides a test method which is not restricted to any particular test system, it is particularly advantageous for use with non-destructive methods of in-process testing such as voltage contrast electron beam testing by any suitable apparatus such as disclosed in U.S. Pat. No. 4,829,243.

The present invention is directed to a method of testing networks having a plurality of nodes by (1) electrically charging one of the nodes in the network and testing the other nodes for electrical charges for measuring continuity or opens in the network and (2) detecting shorts in the network by finding voltages on the network which are not intentionally charged.

The present invention is further directed to a method of testing in which various levels of testing may be performed for detecting various levels of electrical faults. The method provides a compromise between various levels of testing depending upon the trade-off desired between reducing testing costs or obtaining information about faults.

SUMMARY

The present invention is directed to a method of detecting defects in a plurality of electrical networks on a substrate in which each network includes one or more nodes. The method includes a first testing pass of electrically charging one node of each network and determining if any of the other nodes are uncharged thereby detecting any opens in the networks. The 1 pass method also includes, for at least each network after the first network charged, before electrically charging one node, testing all of the nodes to determine if any of the nodes are shorted to a previously charged network. If no second pass is to be performed after the first pass, then preferably the 1 pass method terminates as soon as any node is determined to be shorted or uncharged without performing additional testing. The 1 pass method can determine whether a substrate is good or bad.

In accordance with one aspect of the present invention, there is provided a method of detecting defects in a plurality of electrical networks on a substrate in which each network includes a plurality of nodes, comprising, for at least each network after the first network charged, before electrically charging any nodes on the network, testing all the nodes on the network to determine if any of the nodes are charged and thereby shorted to a previously charged network; for each network, electrically charging one node on the network, then testing all the other nodes on the network to determine if any of said other nodes are uncharged and thereby disconnected, and terminating the test if a node is determined to be shorted or uncharged and listing the substrate as bad.

The present invention further includes making a second testing pass, or 2 pass method, wherein the 1 pass method is performed except that testing does not stop upon encountering a first defect, and each defect is listed (i.e. characterized) as "S" (shorted) or "U" (uncharged). Every node detected as uncharged or shorted is charged. After charging every such node, a node of each "G" (good) network which did not include an uncharged or shorted node is tested to determine if any of the latter networks are shorted to the former networks. The 2 pass method can detect all faulty networks.

In accordance with another aspect of the present invention, there is provided a method of detecting defects in a plurality of electrical networks on a substrate in which each network includes a plurality of nodes, including, during a first testing pass, (a) for at least each network after the first network charged, before electrically charging any nodes on the network, testing all the nodes on the network to determine if any of the nodes are charged and thereby shorted to a previously charged network, and listing any such shorted nodes, and (b) for each network, electrically charging one node on the network, then testing all the other nodes on the network to determine if any of said other nodes are uncharged and thereby disconnected, and listing any such uncharged nodes; and then during a second testing pass, after the charges are removed from each node on each network, charging every node listed as uncharged or listed as shorted, and testing a node on each remaining network, defined as a network that does not include a node listed as uncharged or listed as shorted, to determine if said remaining network is charged and thereby shorted, and listing any such shorted remaining networks; thereby determining which of said networks are defective.

Yet a still further object of the present invention is a more sophisticated embodiment of the 2 pass method. In addition to the classification of "S" or "U" nodes as mentioned above, any node of a network containing "S" or "U" nodes that has not itself been so classified is classified as a "C" node. A group of one or more "C" nodes comprises a "C" subnetwork. Any short circuits between 1) any "S" or "U" nodes and 2) any other "S", "U", "G" or "C" nodes are detected. This is accomplished by making a second testing pass in which every node which was detected as shorted or uncharged by the 1 pass method above is charged separately and in sequence. After charging each node, the method includes testing all other nodes which were detected as uncharged or shorted or a node of a network detected as connected to the node charged by the 1 pass method above which also contains a node detected as unchanged or shorted, for an electrical charge to determine if such other nodes are shorted to one of the separately and sequentially charged nodes. The second embodiment of the 2 pass method can determine precisely how the faulty nodes or nets are connected, and thus detects all functional faults.

Other and further objects, features and advantages will be apparent from the following description of presently preferred embodiments of the invention, given for the purpose of disclosure, and taken in conjunction with the accompanying drawings.

BRIEF DESCRIPTION OF THE PREFERRED EMBODIMENTS

Figure 1:
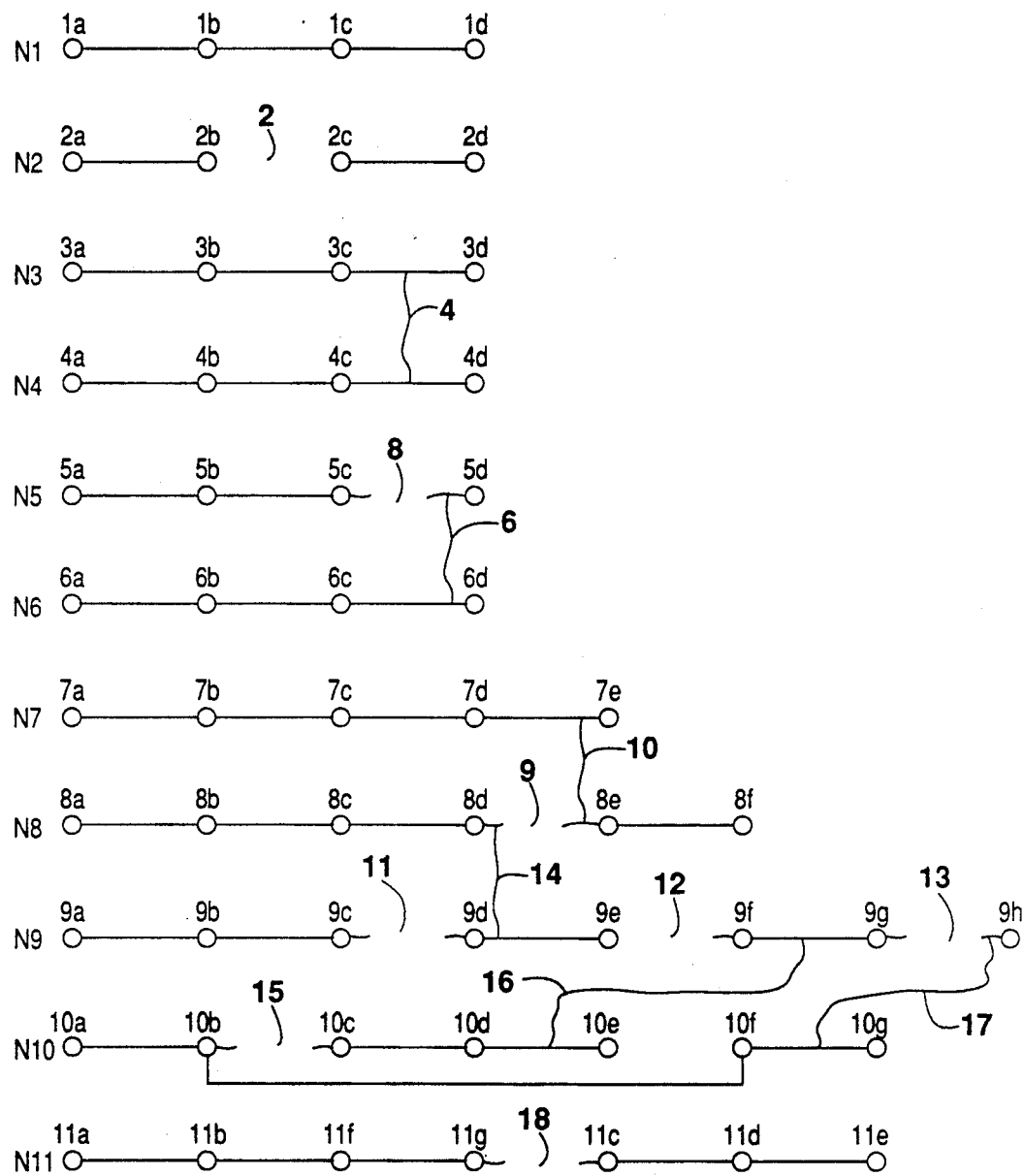
FIG. 1 is an electrical schematic of a plurality of networks, each having at least one node and in which various electrical faults exist.

Referring now to FIG. 1, for purposes of illustration only, a plurality of electrical networks N1, N2, N3, N4, N5, N6, N8, N9, N10 and N11 are shown, each of which includes at least one node. Thus, network N1 includes nodes 1a, 1b, 1c and 1d. Similarly, network N2 includes nodes 2a, 2b, 2c and 2d. The networks N1 through N11 may be on any electrical component, for example, VLSI chip substrates, which may involve thousands of wiring networks in a single package with more than 10,000 chip interconnect bonding pads. While various types of apparatus may be provided to implement the test method of the present invention, the present invention is particularly useful with a voltage contrast electron beam tester such as disclosed in U.S. Pat. No. 4,829,243 which is hereby incorporated by reference. However, any mechanism which has the ability to charge an electrical conductor to a level that can be discriminated from an uncharged state for the duration of the test sequence can be used.

In testing for continuity or opens in a network such as network N1, one of the nodes, such as node 1a, is charged to a known voltage and the rest of the nodes 1b, 1c and 1d are tested for a voltage charge. In the network N1 there are no defects and thus a voltage charge will be measured on each of the nodes 1b, 1c and 1d. However, net N2 has an open between nodes 2b and 2c and thus when node 2a is charged, while node 2b will also be charged, the nodes 2c and 2d will be uncharged.

Shorts between networks can also be detected by finding voltages on networks which are not intentionally charged. That is, network N1 is tested for openings as previously described and before testing for opens in network N2, the nodes 2a, 2b, 2c and 2d are tested for charges in order to determine if they are shorted to the previously charged network N1. In this case there are no shorts between networks N1 and N2. Thereafter, the testing continues with the network N2 being tested for opens. An open 2 between nodes 2b and 2c would be detected by determining that node 2c is uncharged. If it is only desired to know whether the substrate is good or bad, then preferably the substrate will be listed as bad and the test will terminate without testing any other nodes on any networks. However, for illustration purposes, additional information is desired so the 1 pass test continues. Network N3 is next tested for shorts. Continuing the testing, network N3 is tested for opens and the network N4 is tested for shorts. In this case, short 4 is detected as existing on the network N4. However, the sequence of testing opens and shorts will not identify which network is shorted to network N4. The 1 pass test merely indicates that network N4 is shorted to a previously charged network which is not yet identified. Also, in following this 1 pass open and short testing, such a procedure will not detect the short 6 between network N5 and network N6 in which an open 8 exists in network N5. That is, while network N5 will be noted as having a defect, the short 6 will not be detected in this arrangement due to the open defect in N5. Testing can continue with network N7 for which no defects are detected and proceed to network N8, in which open 9 exists between nodes 8d and 8e, and short 10 exists between node 8e and node 7e on N7. Open 9 is detected as existing on N8 which is labelled defective. Testing continues with network N9 containing open 11 between nodes 9c and 9d, open 12 between nodes 9e and 9f, and open 13 between nodes 9g and 9h. Also, short 14 exists between node 9d and node 8d on N8. The existence of open 11 is detected and N9 is labelled defective. The test continues with network N10 wherein nodes 10a and 10b are supposed to be connected to subnetwork nodes 10c, 10d, 10e and to subnetwork nodes 10f and 10g. Open 15 between nodes 10b and 10c, short 16 between node 10e and node 9f on N9, and short 17 between node 10f and node 9h on N9 exist. Open 15 will be detected and N10 listed (i.e. reported) as defective. Finally, testing continues to network N11 in which the series arrangement of nodes is 11a, 11b, 11f, 11g, 11c, 11d and 11e but the nodes are tested in order (i.e. 11a, 11b, 11c, etc.). Open 18 between nodes 11g and 11c is detected and N11 is labelled defective.

It may not be necessary to determine the exact location of the break or open 2, and multiple opens along the net would be irrelevant if all nodes will be disconnected from the net N2 for repair or the net N2 will be abandoned. That is, the necessity of determining the location of any defect depends on the purpose of conducting the test. Various test purposes include (1) determining whether the part is good or bad; (2) identifying bad networks; and (3) a complete functional description of network interconnection.

The 1 pass open and short testing procedure described above can be employed to discriminate good substrates from bad substrates, which may be sufficient in many cases as the occurrence of defects may be infrequent. The 1 pass test which effectively is a simple open and short test may be sufficient particularly where the substrate needs to be labelled good or bad but fault location is not required. The 1 pass test may be advantageous since the relatively few decisions, measurements, and charge excitations permit rapid testing. Furthermore, the 1 pass test can be discontinued after the first defect is detected, which would be open 2 for the networks in FIG. 1. However, it may be desirable to more fully test the networks to detect more of the defects therein in order to provide further fault information. The present invention can further utilize the alternating open and short testing procedure previously described in making a first testing pass through the networks, and in addition, record or make a listing of the detected defects, and in addition, perform a second pass test through the networks for more fully finding and identifying various types of defects, such as all possible combinations of opens and shorts.

Figure 2A:
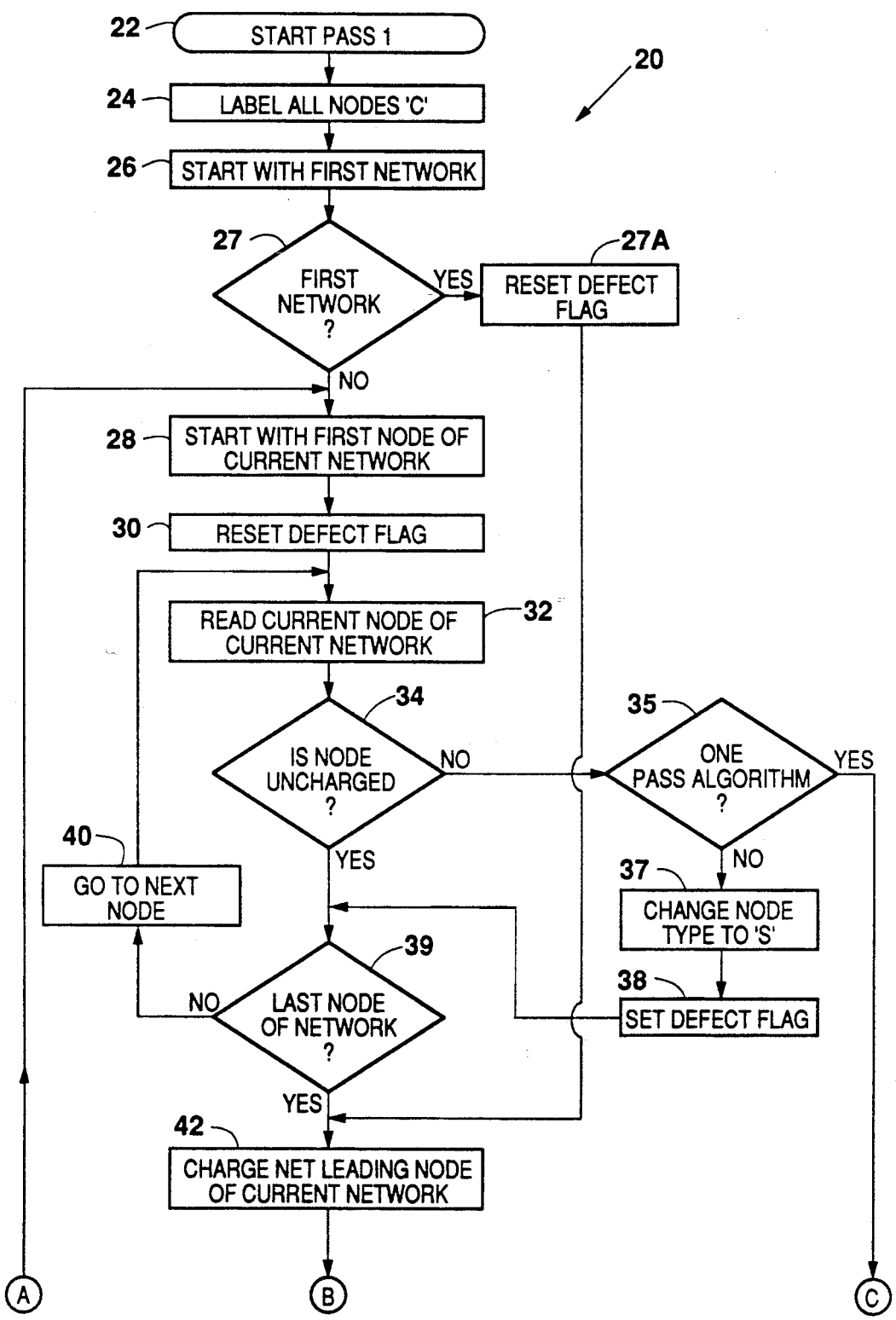
FIGS. 2A-2B are a logic diagram of one testing pass for detecting opens in each network and shorts to previously charged networks.
Figure 2B:
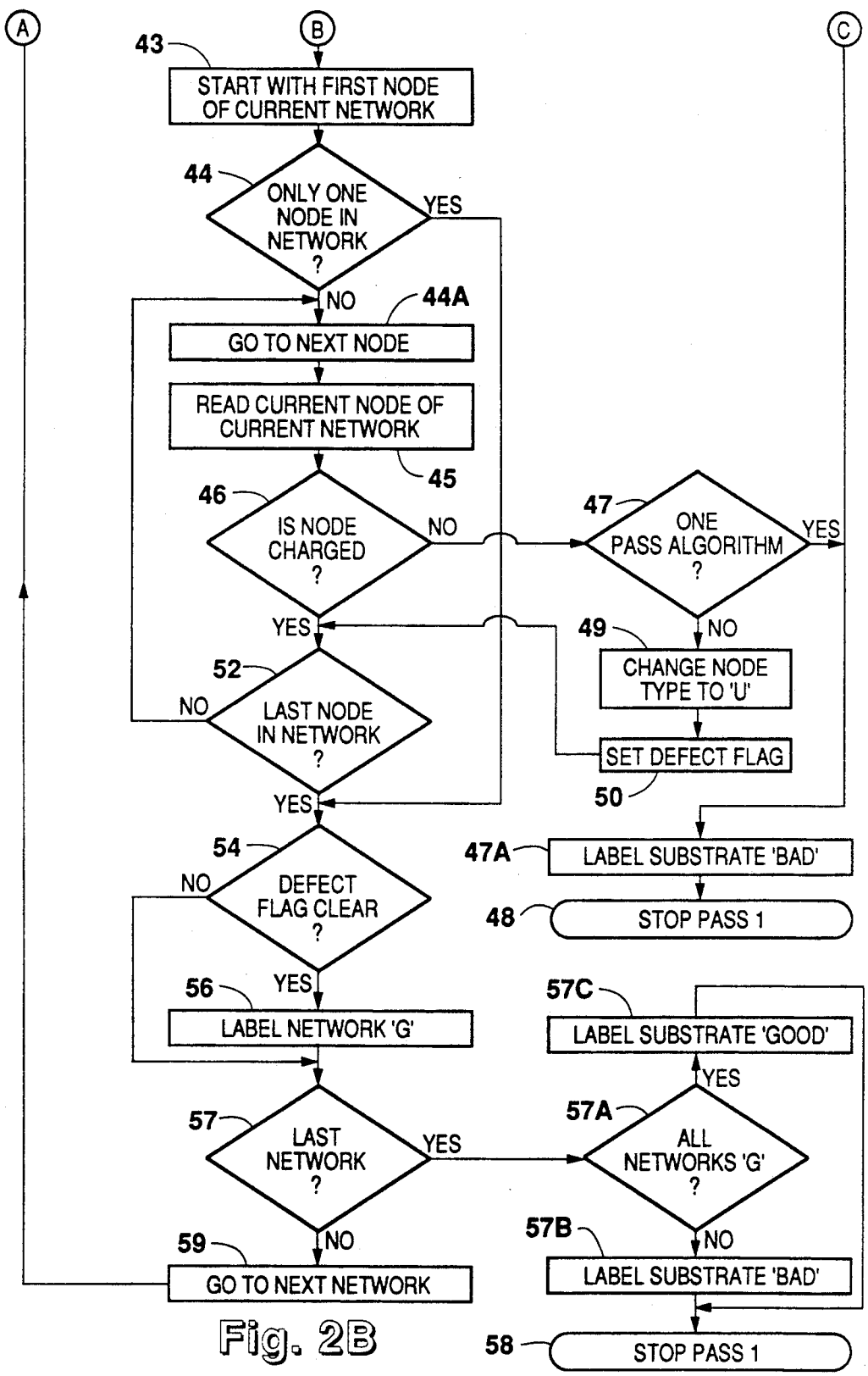

Referring now to FIGS. 2A-2B, the method of a one pass or the first pass of a two pass test is shown in the logic flow diagram 20. In step 22, the test is started, proceeds to step 24 and labels or lists all of the nodes in the entire substrate as "C" to indicate that they are a part of a connected "C" subnetwork. That is, unless later relabelled each node in the substrate is listed as "C" by default. The test proceeds to step 26 which starts with the first network such as N1 of FIG. 1.

It is to be noted that steps 28 through 40 are not required for the first network N1 since the purpose of steps 28–40 is to detect a short to a network previously charged. For further optimization, steps 27 and 27A can be included between steps 26 and 28 which will branch to step 42 if the current network is the first network.

Starting with step 42, the open circuit detection loop is started by charging the net leading node of the current network at step 42 such as charging the leading node 1a of network N1 (FIG. 1). The test proceeds to step 43 to start with the first node of the current network. It is noted that steps 44A through 52 are not required if the network contains only one node. For further optimization, step 44 can be included between steps 43 and 44A which will branch to step 54 if the current network has only one node. If additional nodes remain, or if step 44 is deleted, the test proceeds to step 44A. Using network N1 with step 44, the test continues at step 44A, the node counter is incremented, and the second node is selected. In step 45, the loop will begin with the second node 1b. In step 45 the charge on the current node of the current network is read.

At step 46, if the node tested in step 45 is uncharged (indicating an open circuit) the test moves to step 47. If this is a one pass test, the network is labeled "bad" in step 47A and the test is ended at step 48. If this is the first pass of a two pass test, the node is listed or labeled in step 49 as "U" (uncharged), and thereby disconnected or open, and the defect flag is set in step 50 and the test proceeds to step 52.

On the other hand, if the node is charged, the test moves from step 46 to step 52. In step 52, if this is not the last node of the network, the node counter is incremented at step 44A and the open circuit detection loop returns to step 45. This procedure continues for the remainder of the nodes, such as 1c and 1d, in the current network being tested. After the last node of the network N1 being tested has been tested, the loop proceeds to step 54 to determine if a defect has been encountered. If not, the process continues to step 56 where the current network is labeled as "G" (good) in which no defects were encountered. The process continues to the network determining step 57 and, if not the last network, to step 59 which increments the network counter and returns the loop to the short circuit defect detection loop starting at step 28. If this were the last network the test would then proceed to substrate determining step 57A. If all networks were labelled "G", the substrate would be labelled "good" in step 57B and the test would stop in step 58. Otherwise the substrate would be labelled "bad" in step 57C and the test would stop in step 58.

Since additional networks remain, in step 28 the test is started with the first node of the then current network. That is, if network N1 was previously tested in the open circuit detection loop, step 28 would start with the next network such as N2. In step 30, a defect flag is utilized to indicate the status of the current network and this flag is reset (i.e. cleared) at the beginning of each network loop at step 30. In step 32, the current node, for example, node 2a, of the network N2 is tested. In step 34, if the node is charged (indicating that it is shorted), and step 35 indicates this is a one pass test, the substrate is labelled "bad" in step 47A and the is test stopped in step 48. However, if this is a multiple pass test, the node is listed or labeled as "S" (shorted) in step 37, and in step 38 the defect flag is set. However, if the node is uncharged in step 34, the test flow moves to step 39, and if this is not the last node, the node counter is incremented in step 40 to go on to and test the next node, such as node 2b. After all of the nodes in network N2 have completed the short circuit detection loop, the network N2 is subjected to the open circuit detection loop beginning at step 42.

The one pass test of method 20 continues alternately charging the leading node of the network testing for opens and testing for shorts in the next network. It may be desirable, however, to ascertain more than merely the existence of faulty networks of an electrical component or substrate by further investigation of detected faults (i.e. opens or shorts). For example, in FIG. 1, the 1 pass open and short test can indicate that network N4 is shorted by a short 4. However, that test would merely indicate that network N4 was shorted to a previously charged but unidentified network. By running a second test pass over the networks, as shown in FIG. 3, the unknown shorted networks such as N3 can be identified.

Figure 3:
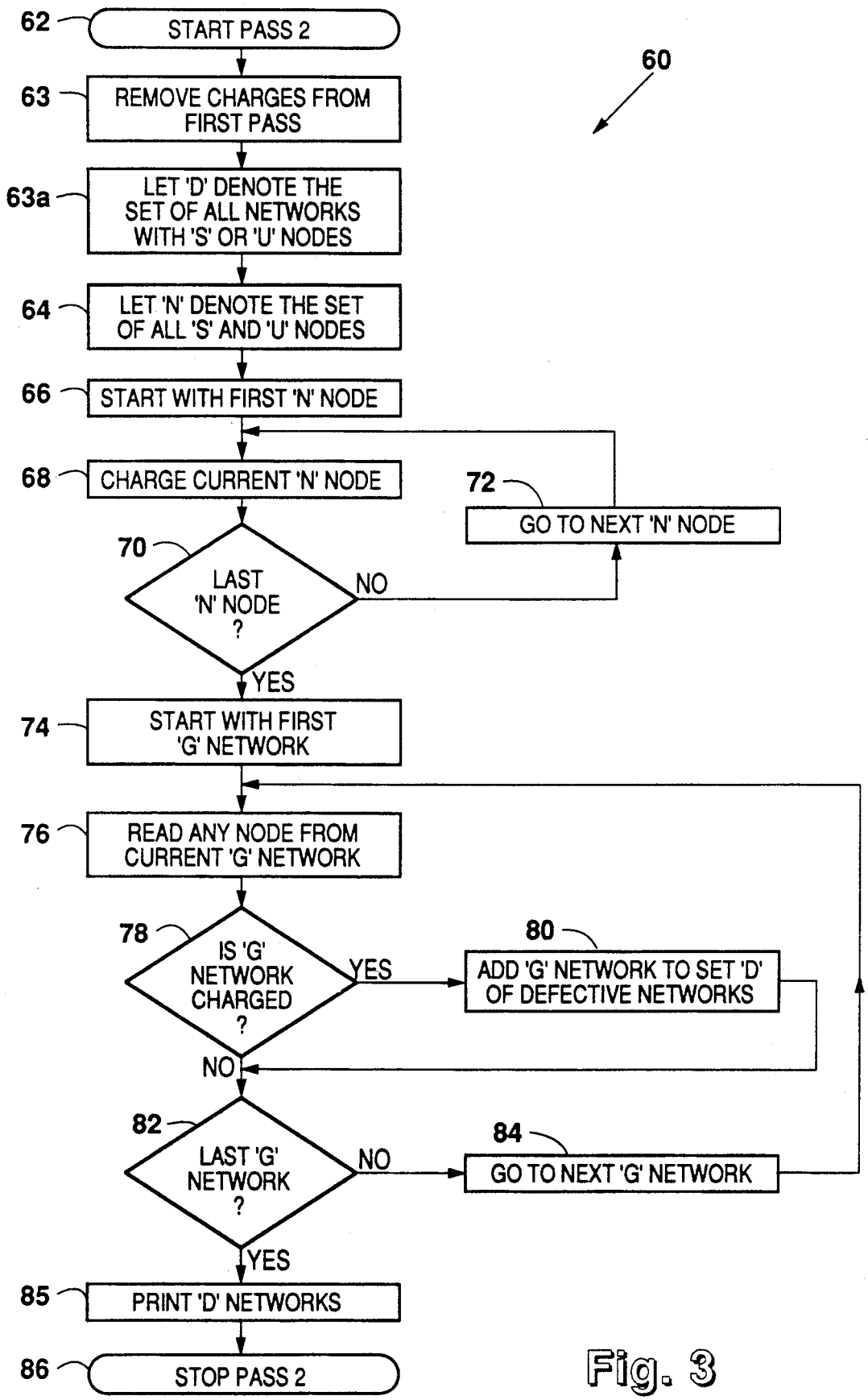
FIG. 3 is a logic diagram illustrating a second testing pass for further discrimination of faults.

Referring now to FIG. 3, a second pass test indicated by the reference numeral 60 is shown which starts at step 62 after the finish of the first pass test 20 shown in FIGS. 2A-2B. When first pass test 20 is followed by a second test pass, each defective node discovered will be labelled as follows: "S" designates shorted nodes (step 37 of FIG. 2A); "U" designates uncharged nodes (step 49 of FIG. 2B); "G" designates networks not containing "S" or "U" nodes (step 56 of FIG. 2B); and "C" designates the remaining nodes (step 24 of FIG. 2A) that are not classified as "S" or "U". That is, "C" nodes are the portions of a defective net (i.e. containing "S" or "U" nodes) which are connected to the net leading node (step 42 of FIG. 2A), thereby forming a "C" subnetwork. However, if the second pass of FIG. 3 is used then the "C" classification is not required. For example, referring back to FIG. 1, nodes 7a-7e of N7 are "G" type nodes and N7 is labelled a "G" type network. Nodes 8a-8d of N8 are classified as type "C" and nodes 8e-8f are classified as type "S". On set N9 nodes 9a-9c are "C" nodes comprising a "C" subnetwork, nodes 9d-9e are "S" type nodes, and nodes 9f-9g are "U" nodes. The nodes of nets N10 and N11 are arranged in other physical or sequential positions. Nodes 10a, 10b, 10f and 10g of N10 are "C" type nodes whereas nodes 10c-10e are "U" type nodes. Likewise, nodes 11a, 11b, 11f and 11g of N11 are "C" type nodes whereas nodes 11c-11e are "U" type nodes.

In step 63 any charge left by the first pass is removed from each node on each network. In step 63A, the list or set "D" (defective) signifies all defective networks, that is, all the networks containing nodes which were previously listed or labeled "S" (shorted) in step 37 as well as all of the nodes which were listed or labeled "U" (uncharged) in step 49 of the first pass test of FIGS. 2A-2B. In step 64, the list or set "N" signifies all of the nodes which were previously listed or labeled "S" (shorted) or labeled "U" (uncharged) in the first pass test of FIGS. 2A-2B. Step 66 starts the testing loop at the first "N" node. In step 68, the current "N" node is electrically charged, step 70 determines whether or not it is the last "N" node. If not, in step 72, the loop proceeds to the next "N" node in the list and charges it. When all of the "N" nodes have been charged, step 74 starts with the first network which was listed or labeled as "G" (good) in step 56 of FIG. 2B. Since all of the nodes of a "G" type network are interconnected, in step 76 any node from the current "G" type network is read and in step 78 if the tested "G" type network is charged, such as network N3 in FIG. 1, it is defective and is then, in step 80, added to the list "D" of defective networks. If in step 78 the "G" type network is not the last, step 82 moves to step 84 to implement the next "G" type network for testing. After the last "G" type network has been processed, a list of defective networks in set "D" can be printed in step 85, and the test terminates at step 86. Therefore, the second pass test of FIG. 3 locates any other remaining network which has been labeled as "G" (good) but which in actuality is defective as being shorted to a previously determined defective node.

Although networks N3, N6 and N7 are now discovered as being defective, at this point it can not be determined which specific networks are shorted together since all "S" and "U" nodes were charged before examining the "G" type networks.

Figure 4A:
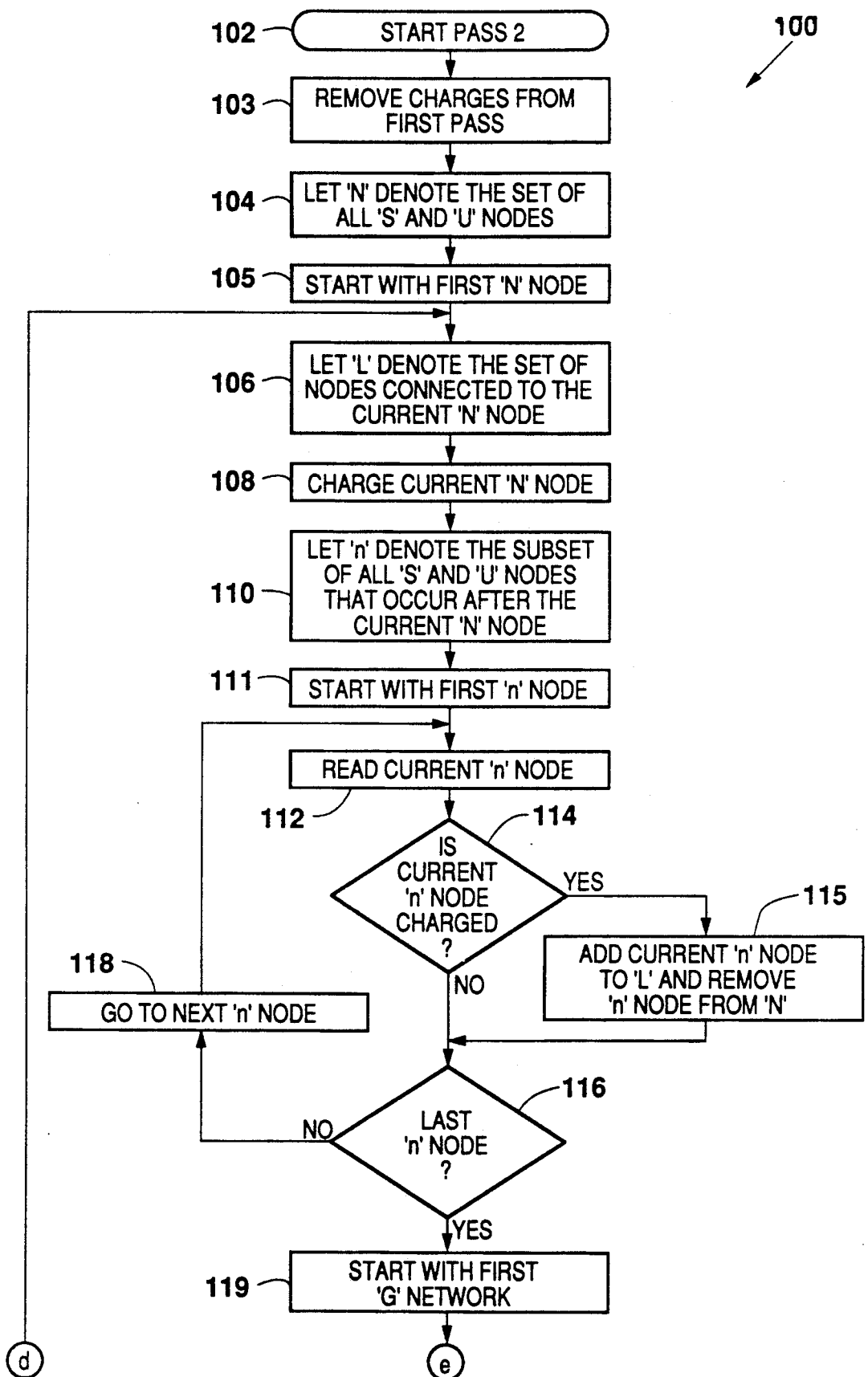
FIGS. 4A-4B are a further embodiment of a second testing pass for discriminating more electrical faults.
Figure 4B:
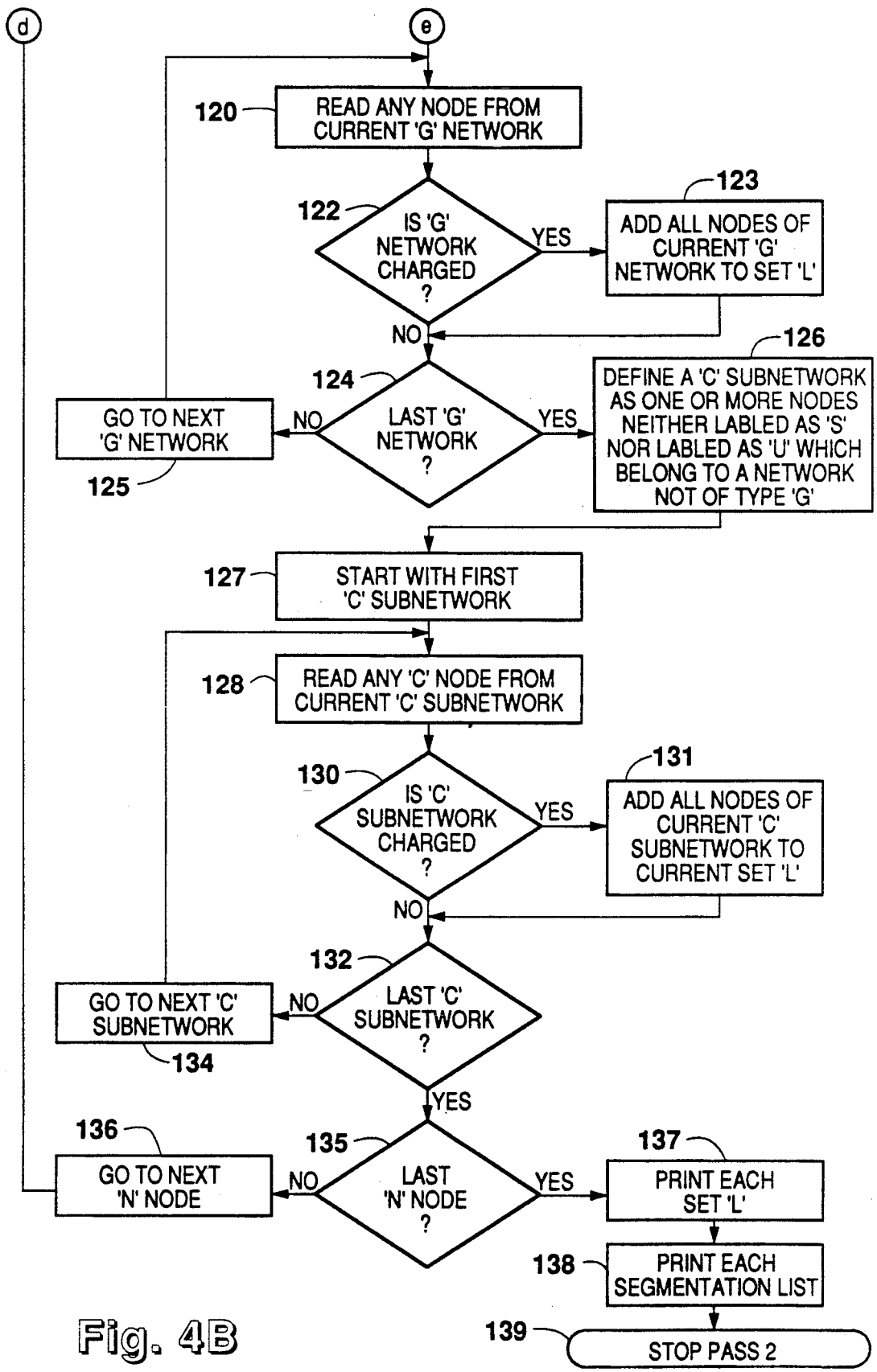

A more sophisticated second pass test may be used, as best seen in FIGS. 4A-4B, after the first pass test of FIGS. 2A-2B, in order to detect other and further defects between networks and thus provide still greater information.

In FIGS. 4A-4B, the second pass of the test 100 starts in step 102. In step 103 any charge left on any node by the first pass is removed. Step 104 again denotes the set or list "N" of all "S" and "U" nodes as listed or labeled in steps 37 and 49 of FIGS. 2A-2B. In step 105 the first "N" node is selected. In step 106, the loop is entered and a set or list "L" denotes the list of nodes which are connected to the current "N" node. In step 108, the current "N" node is charged. In step 110, "n" denotes the subset of all "S" and "U" nodes that occur after the current "N" node. In step 111 the first "n" node is selected, and in step 112 the current "n" node is read. Step 114 determines whether the current "n" node is charged, that is, electrically connected to the current "N" node. If the answer is yes, in step 115, the "n" node is added to the current component list "L", but is now removed from the set "N" in order to prevent any overlapping in the component list. However, if the current "n" node is uncharged, the test moves directly to another decision in step 116 to determine whether it is the last "n" node. If it is not the last "n" node, the loop moves to step 118 to the next "n" node.

After the last "n" node has been tested in step 116, the loop is started which detects shorts between the "G" type networks and any listed "S" or "U" nodes. Step 119 starts with the first "G" type network, step 120 reads one of the nodes from the current "G" type network, step 122 determines whether the current "G" type network is charged. If charged, it is therefore connected to and shorted to an "S" or "U" node and in step 123 each of the nodes of the current "G" type network is added to the current component list "L". Whether or not the "G" type network is shorted, step 124 determines whether it is the last network and if not step 125 implements the next "G" type network into the testing loop.

Figures 5, 6, 7:
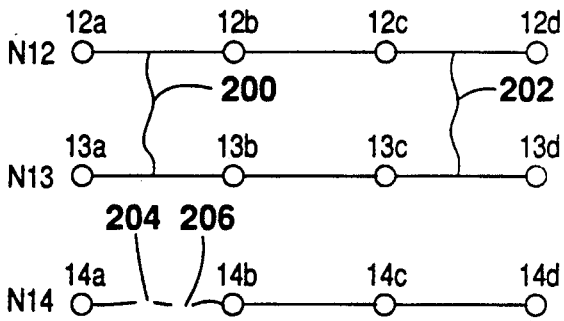
FIG. 5 is a list of the defective connected nodes for the networks in FIG. 1 which can be generated by a second testing pass.
FIG. 6 is a list of the defective connected nodes for each individual network in FIG. 1 which can be generated by a second testing pass.
FIG. 7 illustrates examples where the functional defect is found but the actual physical defect is not precisely described.

After testing the last "G" type network, a loop is entered which detects shorts between "C" subnetworks and any "S" and "U" nodes. In step 126 a group of one or more non-defective nodes (i.e. neither labeled "S" nor labeled "U") on a defective network (i.e. a network not of type "G") forms a "C" subnetwork. Step 127 starts with the first "C" subnetwork, step 128 reads a node from the current "C" subnetwork, and step 130 determines whether or not a "C" subnetwork is charged and therefore shorted. If yes, step 131 adds the nodes of the current "C" subnetwork to the current component list "L". Step 132 determines whether or not the last "C" subnetwork has been tested and if not step 134 implements the next "C" subnetwork into the testing loop. In step 135, the determination is made of whether the last "N" node has been checked, and if not, step 136 goes to the next "N" node for testing. After checking the last "N" node, step 137 prints each component list "L" in order to identify each block of connected nodes. FIG. 5 shows the component lists generated for the defective connected nodes of networks N1-N11. In step 138 the segmentation lists of defective connected nodes for each specific network is printed. FIG. 6 shows the segmentation lists of defective connected nodes generated for each individual network of the substrate that contains a defect. Since only network N1 is nondefective, the remaining networks N2-N11 are listed. The test is stopped at step 139.

Referring now to FIG. 7, examples are set forth where the 2-pass algorithms of the present invention will detect a functional defect, but the nature of the actual physical defect will not be precisely described. Networks N12 and N13 are shorted together by separate short circuits 200 and 202. This would be detected as a single functional short circuit between networks N12 and N13. Likewise, the separate openings 204 and 206 between nodes 14a and 14b in network N14 would be detected as a single functional opening between nodes 14a and 14b.

The foregoing description of the method of testing electrical components for defects is based upon the illustrated flow-charts and is intended to give the overview of system logic which is executed according to the source code, or alternatively the IBM P.C. object code, contained in the microfiche appendix. Conventional alterations of the flow-charts, source code or object code to meet other specified applications is a matter within the ordinary skill in the art. For instance, a decision step 126A could be added after step 126 which would branch to step 135 in the event no "C" subnetworks were detected. And the calculation of set "D" in step 63A could be removed from the 2 pass algorithm and inserted between step 57B and step 58 in the 1 pass algorithm.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A method of detecting defects in a plurality of electrical networks on a substrate in which each network includes a plurality of nodes, comprising:

during a first testing pass, (a) for at least each network after the first network charged, before electrically charging any nodes on the network, testing all the nodes on the network to determine if any of the nodes are charged and thereby shorted to a previously charged network, and listing any such shorted nodes, and (b) for each network, electrically charging one node on the network, then testing all the other nodes on the network to determine if any of said other nodes are uncharged and thereby disconnected, and listing any such uncharged nodes; and then during a second testing pass, after the charges are removed from each node on each network, charging every node listed as uncharged or listed as shorted, and testing a node on each remaining network, defined as a network that does not include a node listed as uncharged or listed as shorted, to determine if said remaining network is charged and thereby shorted, and listing any such shorted remaining networks;

thereby determining which of said networks are defective.

2. The method of claim 1, wherein on the second testing pass, every node listed as uncharged or listed as shorted is charged prior to said testing a node on each of said remaining networks.

3. The method of claim 1 wherein separate networks are charged and tested separately and in sequence.

4. The method of claim 1, further comprising listing as defective each network containing any nodes listed as uncharged or listed as shorted from the first testing pass, and listing as defective each remaining network listed as shorted from the second testing pass.

5. A method of detecting defects in a plurality of electrical networks on a substrate in which each network includes a plurality of nodes, comprising:

during a first testing pass, (a) for at least each network after the first network charged, separately and in sequence, before electrically charging any nodes on the network, testing all the nodes on the network to determine if any of the nodes are charged and thereby shorted to a previously charged network, and listing any such shorted nodes, and (b) for each network, separately and in sequence, electrically charging one node on the network, then testing all the other nodes on the network to determine if any of said other nodes are uncharged and thereby disconnected, and listing any such uncharged nodes; and then during a second testing pass, after the charges are removed from each node on each network, charging separately and in sequence every node listed as uncharged or listed as shorted, and then testing separately and in sequence a node on each remaining network, defined as a network that does not include a node listed as uncharged or listed as shorted, to determine if said remaining network is charged and thereby shorted to at least one of said every node listed as uncharged or listed as shorted, thereby determining which of said plurality of networks are defective and which are non-defective.

6. A method of detecting defects in a plurality of electrical networks on a substrate in which each network includes a plurality of nodes, comprising:

electrically charging one node on a first network, testing all of the other nodes on said first network for electrical charges to determine if any of said other nodes on said first network are uncharged and thereby disconnected from said one node, listing any of said other nodes on said first network which are uncharged, testing all of the nodes on a second network for electrical charges to determine if any of the nodes on said second network are shorted to a previously charged network, listing any of said nodes on said second network which are shorted, electrically charging one node on said second network, testing all of the other nodes on said second network for electrical charges to determine if any of said other nodes on said second network are uncharged and thereby disconnected from said one charged node on said second network, listing any of said other nodes on said second network which are uncharged, for each additional network, in sequence, before charging any nodes on said additional network, testing all of the nodes on said additional network for electrical charges to determine if any of said nodes on said additional network are shorted to a previously charged network, listing any nodes on said additional network which are shorted, electrically charging one node on said additional network, testing all of the other nodes on said additional network for electrical charges to determine if any of said other nodes on said additional network are uncharged and thereby disconnected from said one node on said additional network, and listing any of said other nodes on said additional network which are uncharged, defining the remaining networks as networks which have no nodes listed as uncharged or listed as shorted, removing the charges from all nodes on all networks, electrically charging each node listed as uncharged or listed as shorted, and testing a node on each remaining network for an electrical charge to determine if said remaining network is shorted to one of said nodes listed as uncharged or listed as shorted, thereby determining which of said networks are defective due to an undesired short circuit or disconnection.

7. The method of claim 6, wherein every node listed as uncharged or listed as shorted is charged prior to said testing a node on each remaining network.

8. The method of claim 7, wherein each node listed as uncharged or listed as shorted is charged separately and in sequence, and said testing a node on each remaining network is performed separately and in sequence.

9. The method of claims 1 or 2 or 3 or 4 or 5 or 6 or 7 or 8, wherein each node listed as uncharged or listed as shorted is listed in a first list and is electrically charged separately and in sequence, and including, for each node in said first list being electrically charged, preparing a second list of nodes connected to said node being electrically charged, testing all other nodes listed in said first list after said node being electrically charged for an electrical charge to determine if any of said all other nodes in said first list are shorted to said node being electrically charged, adding to said second list of nodes connected to said node being electrically charged each of said all other nodes in said first list determined to be charged and thereby shorted to said node being electrically charged, deleting from said first list each of said all other nodes added to said second list, for each of said remaining networks determined to be shorted to at least one of said nodes listed as uncharged or listed as shorted, adding to said second list of nodes connected to said node being electrically charged each node of said remaining network determined to be shorted, preparing a third list of subnetworks, defined as one or more nodes, neither listed as uncharged nor listed as shorted, on a network containing at least one node listed as uncharged or listed as shorted, for each subnetwork, testing a node on said subnetwork to determine if said subnetwork is charged and thereby shorted to said node being electrically charged, and adding to said second list of nodes connected to said node being electrically charged each node of said subnetwork determined to be shorted, thereby determining how the defective nodes are connected.

* * * * *

UNITED STATES PATENT AND TRADEMARK OFFICE
CERTIFICATE OF CORRECTION

PATENT NO. : 5,122,753
DATED : June 16, 1992
INVENTOR(S) : Myers et al

It is certified that error appears in the above-indentified patent and that said Letters Patent is hereby corrected as shown below:

Column 3, lines 3-4, change "un-changed" to -- un-charged --.

Column 3, line 41, insert -- N7, -- after "N6,".

Column 3, line 53, change "4,829.243" to -- 4,829,243 --.

Column 6, line 20, change "is test" to -- test is --.

Column 6, line 64, change "set" to -- net --.

Signed and Sealed this

Twenty-sixth Day of October, 1993

Attest:

BRUCE LEHMAN

Attesting Officer     Commissioner of Patents and Trademarks